United States Patent
Plesski et al.

(10) Patent No.: US 12,431,855 B2
(45) Date of Patent: Sep. 30, 2025

(54) ACOUSTIC RESONATORS WITH HIGH ACOUSTIC VELOCITY LAYERS

(71) Applicant: Murata Manufacturing Co., Ltd., Nagaokakyo (JP)

(72) Inventors: Viktor Plesski, Gorgier (CH); Julius Koskela, Helsinki (FI); Ventsislav Yantchev, Sofia (BG); Patrick Turner, San Bruno, CA (US); Neal Fenzi, Santa Barbara, CA (US); Robert B. Hammond, Santa Barbara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 1052 days.

(21) Appl. No.: 17/408,253

(22) Filed: Aug. 20, 2021

(65) Prior Publication Data

US 2022/0060167 A1    Feb. 24, 2022

Related U.S. Application Data

(60) Provisional application No. 63/068,893, filed on Aug. 21, 2020.

(51) Int. Cl.
| H03H 9/56 | (2006.01) |
| H03H 3/02 | (2006.01) |
| H03H 9/02 | (2006.01) |
| H03H 9/205 | (2006.01) |

(52) U.S. Cl.
CPC .......... *H03H 9/02015* (2013.01); *H03H 3/02* (2013.01); *H03H 9/02228* (2013.01); *H03H 9/205* (2013.01); *H03H 9/568* (2013.01)

(58) Field of Classification Search
CPC .......... H03H 9/02015; H03H 9/02228; H03H 9/205; H03H 9/568
See application file for complete search history.

(56) References Cited

U.S. PATENT DOCUMENTS

| 7,554,244 B1 * | 6/2009 | Ballato | H03H 9/175 310/320 |
| 2013/0249648 A1 * | 9/2013 | Reinhardt | H03H 9/172 29/25.35 |
| 2015/0069882 A1 * | 3/2015 | Umeda | H03H 9/02574 310/313 B |
| 2018/0019730 A1 * | 1/2018 | Takeuchi | H03H 9/72 |
| 2019/0386636 A1 * | 12/2019 | Plesski | H03H 9/02031 |
| 2020/0169241 A1 * | 5/2020 | Yantchev | H03H 9/02031 |
| 2021/0021255 A1 * | 1/2021 | Ballandras | H03H 9/25 |
| 2022/0060167 A1 * | 2/2022 | Plesski | H03H 9/02228 |
| 2022/0123730 A1 * | 4/2022 | Yantchev | H03H 9/02015 |

* cited by examiner

*Primary Examiner* — Bryan P Gordon
(74) *Attorney, Agent, or Firm* — ArentFox Schiff LLP

(57) ABSTRACT

Acoustic resonators, acoustic filter devices and methods of making the same. An acoustic resonator device includes a piezoelectric layer having front and back surfaces, a high acoustic velocity layer on the back surface, and an interdigital transducer (IDT) on the front surface. The high acoustic velocity layer has a higher acoustic velocity than an acoustic velocity of the piezoelectric layer.

20 Claims, 12 Drawing Sheets

ACOUSTIC RESONATORS WITH HIGH ACOUSTIC VELOCITY LAYERS

RELATED APPLICATION INFORMATION

This patent claim priority to provisional patent application No. 63/068,893, filed Aug. 21, 2020, entitled BI-LAYERED LINBO3/DIAMOND MEMBRANE WITH HIGH PIEZO-ELECTRIC COUPLING AND SHEAR ACOUSTIC WAVE VELOCITY HIGHER 7000 M/S, which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation (5G) mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
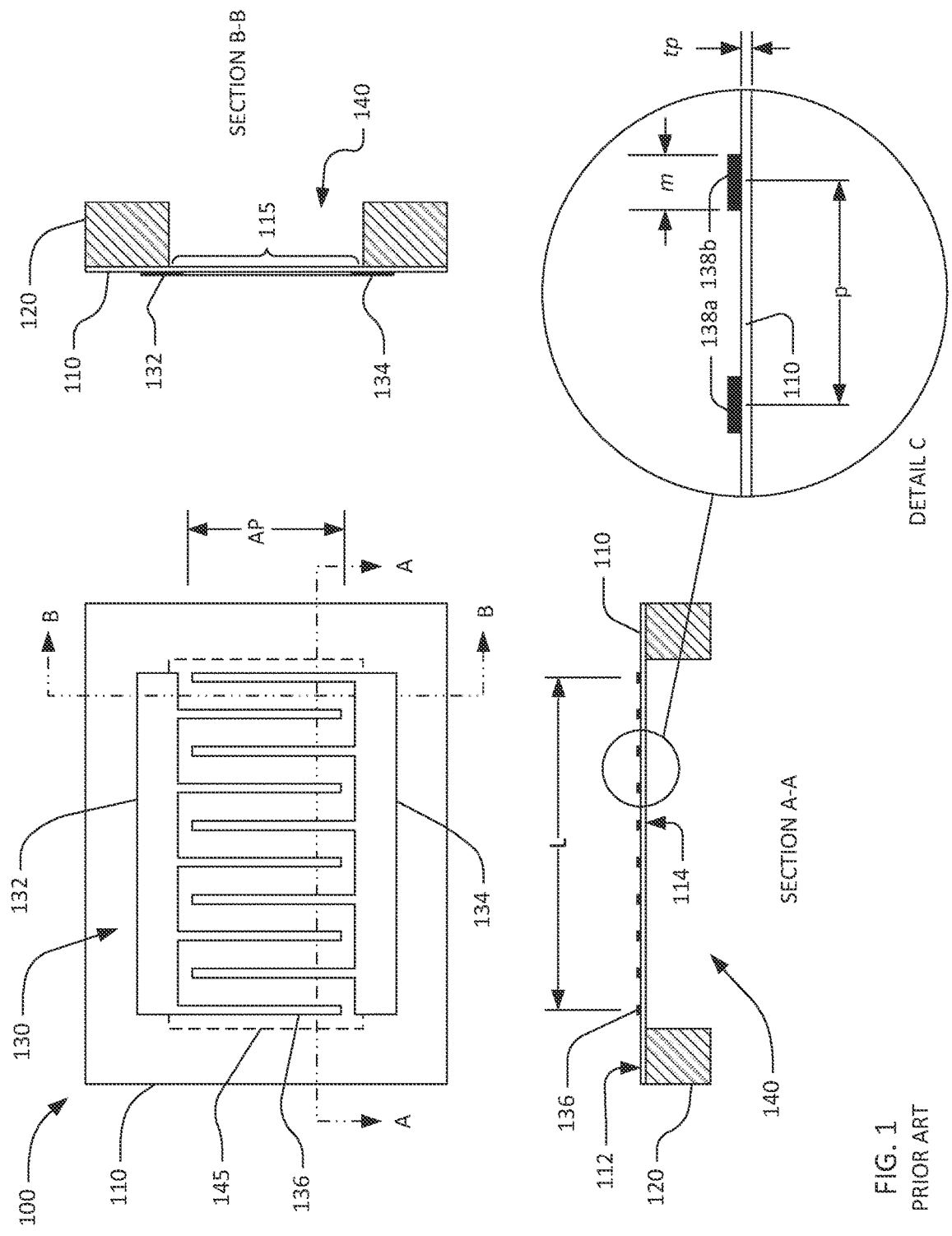
FIG. 1 includes a schematic plan view, two schematic cross-sectional views, and a detail view of an acoustic resonator.

FIG. 1 shows a simplified schematic top view and orthogonal cross-sectional views of a plate wave acoustic resonator 100. These types of acoustic resonators may be used in a variety of RF filters including band-reject filters, band-pass filters, duplexers, and multiplexers.

The acoustic resonator 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate (LN), lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, which is to say the Z axis is normal to the front and back surfaces 112, 114. The piezoelectric plate may be ZY-cut, rotated Y-cut, rotated Z-cut or rotated YX-cut. Acoustic resonator may be fabricated on piezoelectric plates with other crystallographic orientations.

The back surface 114 of the piezoelectric plate 110 is attached to a surface of a substrate 120. In some embodiments, a portion of the piezoelectric plate 110 may form a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the acoustic resonator 100 includes an interdigital transducer (IDT) 130. The IDT 130 includes a first plurality of parallel fingers, such as finger 136, extending from a first busbar 132 and a second plurality of fingers extending from a second busbar 134. The term "busbar" means a conductor from which the fingers of an IDT extend. The busbar can have different (e.g., higher) thickness of metal. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the acoustic resonator 100. A radio frequency or microwave signal applied between the two busbars 132, 134 of the IDT 130 excites a shear (e.g., quasi shear) horizontal (SH0) acoustic mode within the piezoelectric plate 110. The shear horizontal acoustic mode is a bulk shear mode where acoustic energy propagates along a direction substantially parallel to the surface of the piezoelectric plate 110 and with displacements normal, or transverse, to the direction of the electric field created by the IDT fingers (e.g., parallel to the electrodes of the IDT).

The IDT 130 is positioned on the piezoelectric plate 110 such that at least the fingers of the IDT 130 are disposed on the diaphragm 115 that spans, or is suspended over, the cavity 140. As shown in FIG. 1, the cavity 140 has a rectangular shape with an extent greater than the aperture AP and length L of the IDT 130. The cavity may have a different shape, such as a regular or irregular polygon. The cavity may be more or fewer than four sides, which may be straight or curved.

For ease of presentation in FIG. 1, the geometric pitch and width of the IDT fingers are greatly exaggerated with respect to the length (dimension L) and aperture (dimension AP). A typical acoustic resonator has more than 40 parallel fingers in the IDT 130, and may have a few hundreds, of parallel fingers in the IDT 130 Similarly, the thicknesses of the IDT fingers and the piezoelectric plate in the cross-sectional views are greatly exaggerated.

The IDT fingers 138a, 138b may be one or more layers of aluminum, an aluminum alloy, copper, a copper alloy, beryllium, gold, tungsten, molybdenum, chromium, titanium or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Multi-layered fingers, including combination of metals such as Al/Pt, Al/Mo, etc. also can be used. Thin (relative to the total thickness of the conductors) layers of metals such as chromium or titanium may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers. Dimension m is the width or "mark" of the IDT fingers. The fill factor, or mark/pitch ratio of the IDT fingers is typically, but not necessarily, close to 50%. The resonance frequency of the acoustic resonator 100 is inversely proportional to the IDT pitch p. The thickness of the IDT fingers may be from 100 nm to about equal to the width m. The thickness of the busbars (132, 134) of the IDT may be the same as, or greater than, the thickness of the IDT fingers.

Figure 2:
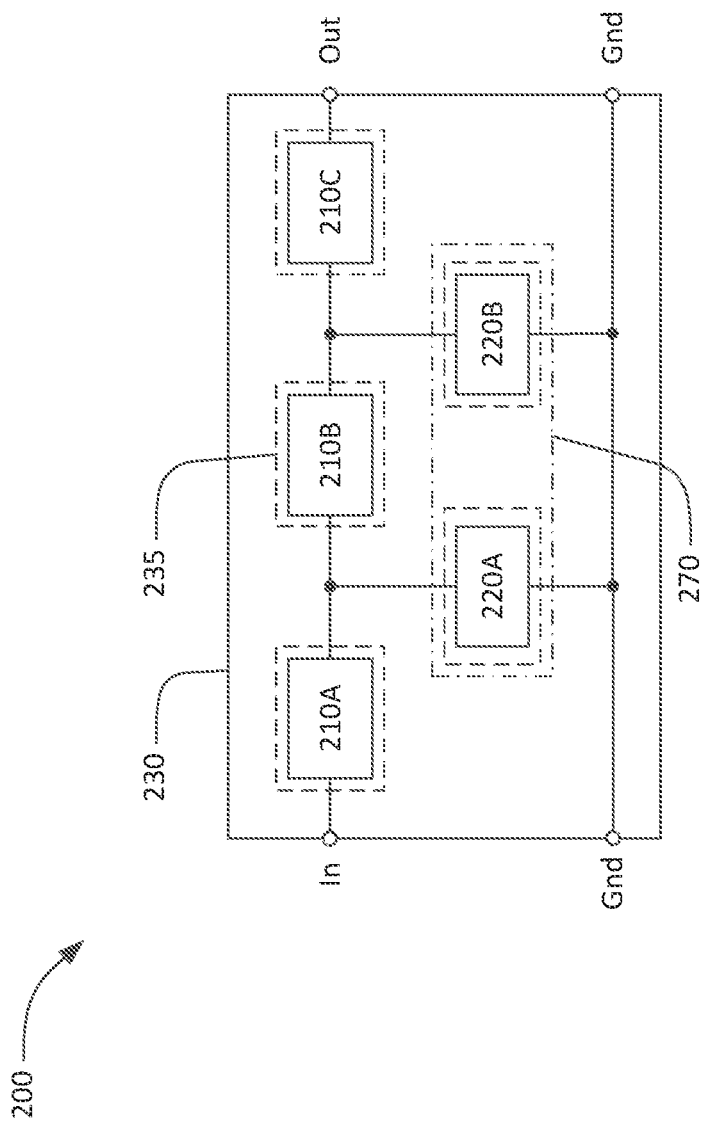
FIG. 2 is a schematic block diagram of a band-pass filter using acoustic resonators.

FIG. 2 is a schematic circuit diagram and layout for a high frequency band-pass filter 200 using acoustic resonators. The filter 200 has a conventional ladder filter architecture including three series resonators 210A, 210B, 210C and two shunt resonators 220A, 220B. The three series resonators 210A, 210B, and 210C are connected in series between a first port and a second port (hence the term "series resonator"). In FIG. 2, the first and second ports are labeled "In" and "Out", respectively. The electric current from the input (e.g., especially in the passband) comes partly to the output through the series resonators. However, the ladder filter 200 is reciprocal (e.g., transmission S12=S21) and usually either port may serve as the input or output of the filter. In some cases physical resonators 210A and 210C can be different. For example, to increase the power handling, resonators with larger areas can be placed near the input. The two shunt resonators 220A, 220B are connected from nodes between the series resonators to ground. Through these shunt resonators, the currents are directed to the ground, especially in the stopband regions. A filter may contain additional reactive components, such as capacitors and/or inductors, not shown in FIG. 2. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and one of the input, the output, or a node between two series resonators.

In the exemplary filter 200, the three series resonators 210A, B, C and the two shunt resonators 220A, B of the filter 200 are formed on a single plate 230 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 2, the cavities are illustrated schematically as the dashed rectangles (such as the rectangle 235). In this example, each IDT is disposed over a respective cavity. In other filters, the IDTs of two or more resonators may be disposed over a single cavity, such as cavity 270, for example.

Each of the resonators 210A, 210B, 210C, 220A, 220B in the filter 200 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 200. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are positioned above the upper edge of the passband. In the passband low complex-valued impedance of the series resonators and high impedance of the shunt resonators work together, providing matching of the source and load impedances of the filter and, thus, low losses.

Lamb and shear acoustic waves in acoustic resonators with LN plates may have high electro-mechanical coupling. Coupling for shear horizontal mode (SH0) in LN can be extremely strong, e.g., having a coupling coefficient $K^2$ of around 50%. However, the acoustic velocity of this mode, close to the shear bulk wave velocity, is relatively low, e.g., around 4 km/s. The resonance frequency of an acoustic resonator using the SH0 mode is approximately the acoustic velocity of the mode divided by twice the IDT pitch. The low acoustic velocity of the SH0 mode in LN means that filters with a center frequency higher than about 3 GHz cannot be manufactured with optical lithography.

High shear wave velocity, e.g., about 11 km/s, is found in diamond, which is not piezoelectric. A bilayer plate including a thin LN layer (e.g., 30-degree YX cut) and a diamond layer can have both a high coupling coefficient and a high acoustic velocity. The acoustic energy is divided between the thin LN layer and the diamond. The resulting acoustic wave is strongly piezoelectrically coupled due to the LN layer while significantly accelerated due to the diamond layer. The properties depend on the relative layer thicknesses. For example, for a 300 nm thick LN layer and 1000 nm thick diamond layer, resonances corresponding to an acoustic velocity of about 6000 m/s with a resonance-antiresonance relative frequency gap (R-a-R) of around 7 percent can be achieved. With 0.3 micron IDT finger width and 0.6 micron IDT pitch, 5 GHz resonators can be realized.

Figure 3:
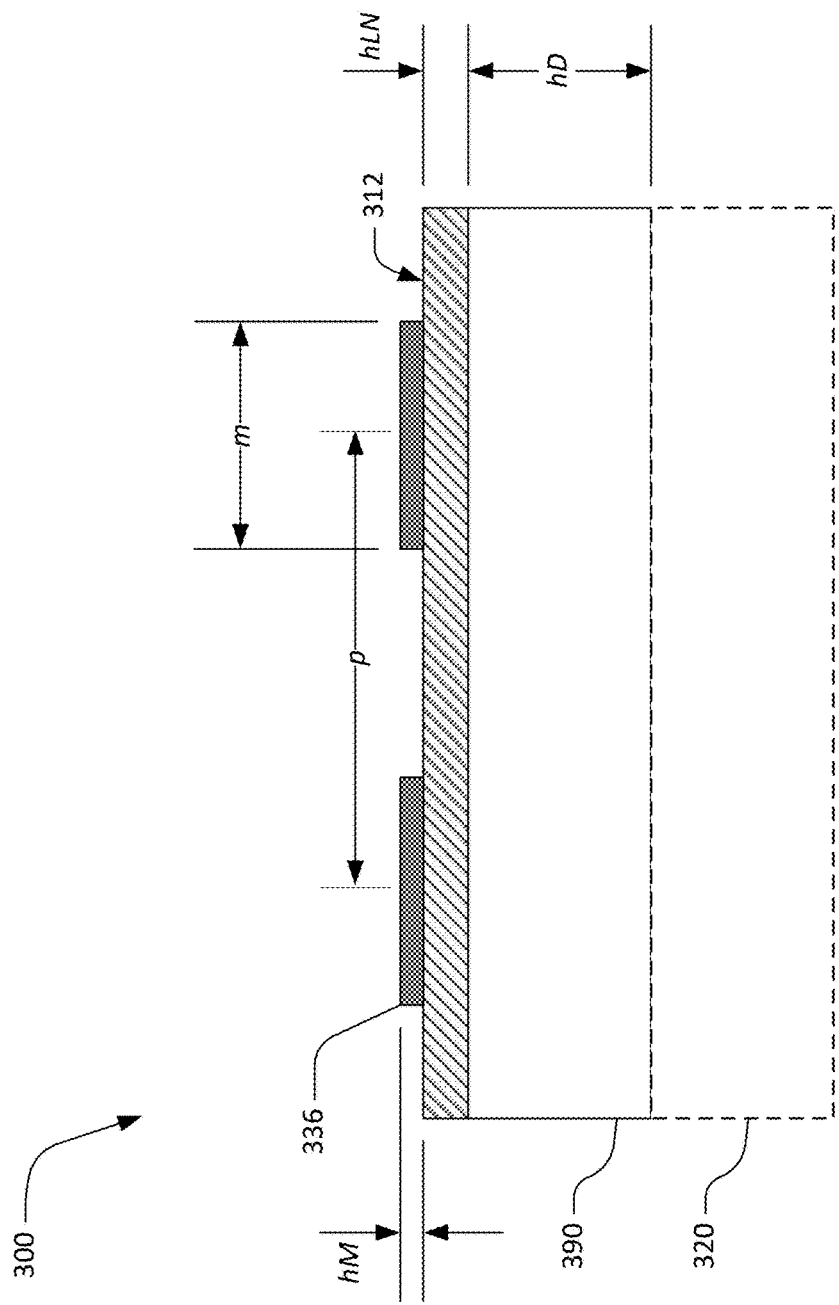
FIG. 3 is a cross-sectional view of an acoustic resonator with a high acoustic velocity layer.

FIG. 3 is a cross-sectional view of an acoustic resonator 300 with a high acoustic velocity layer 390. The high acoustic velocity layer 390, which can be, e.g., diamond or cubic boron nitride having a thickness hD, is on a back side of a piezoelectric layer 312 having a thickness hLN. Typically, both hD and hLN are smaller than pitch p. The piezoelectric layer 312 can be LN, such as 30 degree Y-cut LN. The high acoustic velocity layer 390 can optionally be on a substrate 320 or over a cavity, as described above with respect to FIG. 1. In an example, if the high velocity layer 390 is thicker than 3 microns (e.g., for 3GHz-5 GHz devices), the high velocity layer 390 can be mounted on a dielectric substrate, such as silicon, quartz, or sapphire, and the acoustic vibrations will not reach the substrate. Fingers 336 of an IDT having a thickness hM (typically <12% of λ=2p) are on a front side of the piezoelectric layer 312. The fingers 336 have a width m and a pitch p, as described above with respect to FIG. 1. In an example, the fingers 336 can be aluminum. An exemplary metalization ratio m/p is about 0.5, and an exemplary acoustic aperture AP (as similarly described with respect to FIG. 1) is about 20λ to 60λ.

The acoustic resonators 300 can include other layers between the piezoelectric layer 312 and the high acoustic velocity layer 390, such as silicon oxide (SiOx), to improve temperature stability. Further, diamond's high thermal conductivity will improve power handling of the acoustic resonator 300.

Figure 4:
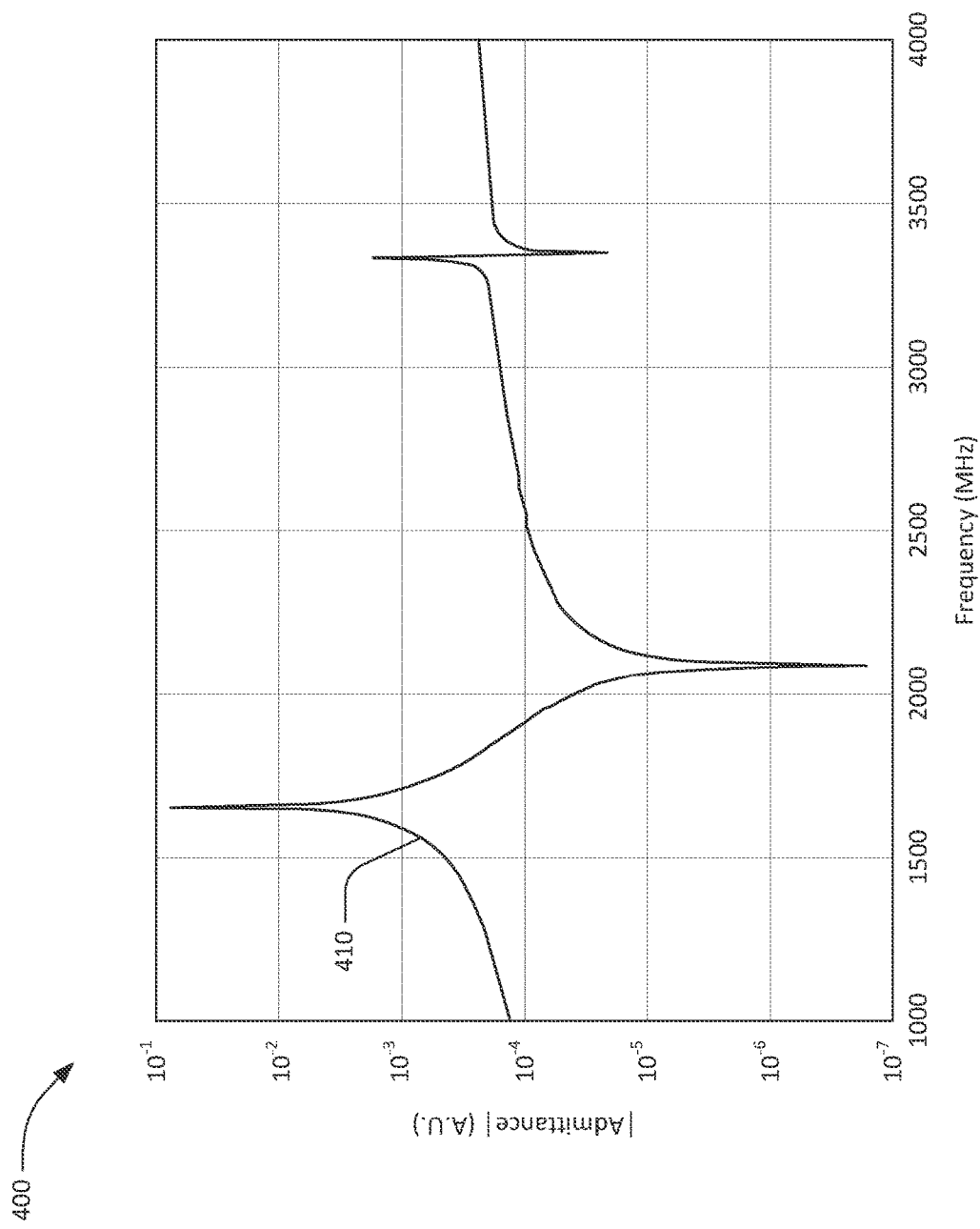
FIG. 4 is a graph of admittance as a function of frequency for an acoustic resonator without a high acoustic velocity layer.

FIG. 4 is a graph 400 of a curve 410 showing simulated admittance as a function of frequency for an acoustic resonator without a high acoustic velocity layer. In this example, p=1 micron, hM=80 nm, and hLN=200 nm LN layer thickness. Resonance frequency is 1658.9 MHz, resonance Q-value is 1125, resonance admittance is 0.076, antiresonance frequency is 2091.9 MHz, antiresonance Q-value is 2450, and R-a-R is 23.1%. High coupling is demonstrated, but resonance frequency corresponds to a low wave phase velocity, 3318 m/s, reduced also by massloading by the fingers. With finger width reduced to 0.3 microns, center frequency of the filter is limited to about 2.7 GHz. The high R-a-R of the resonator supports filters with up to 35% relative bandwidth without matching.

Figure 5:
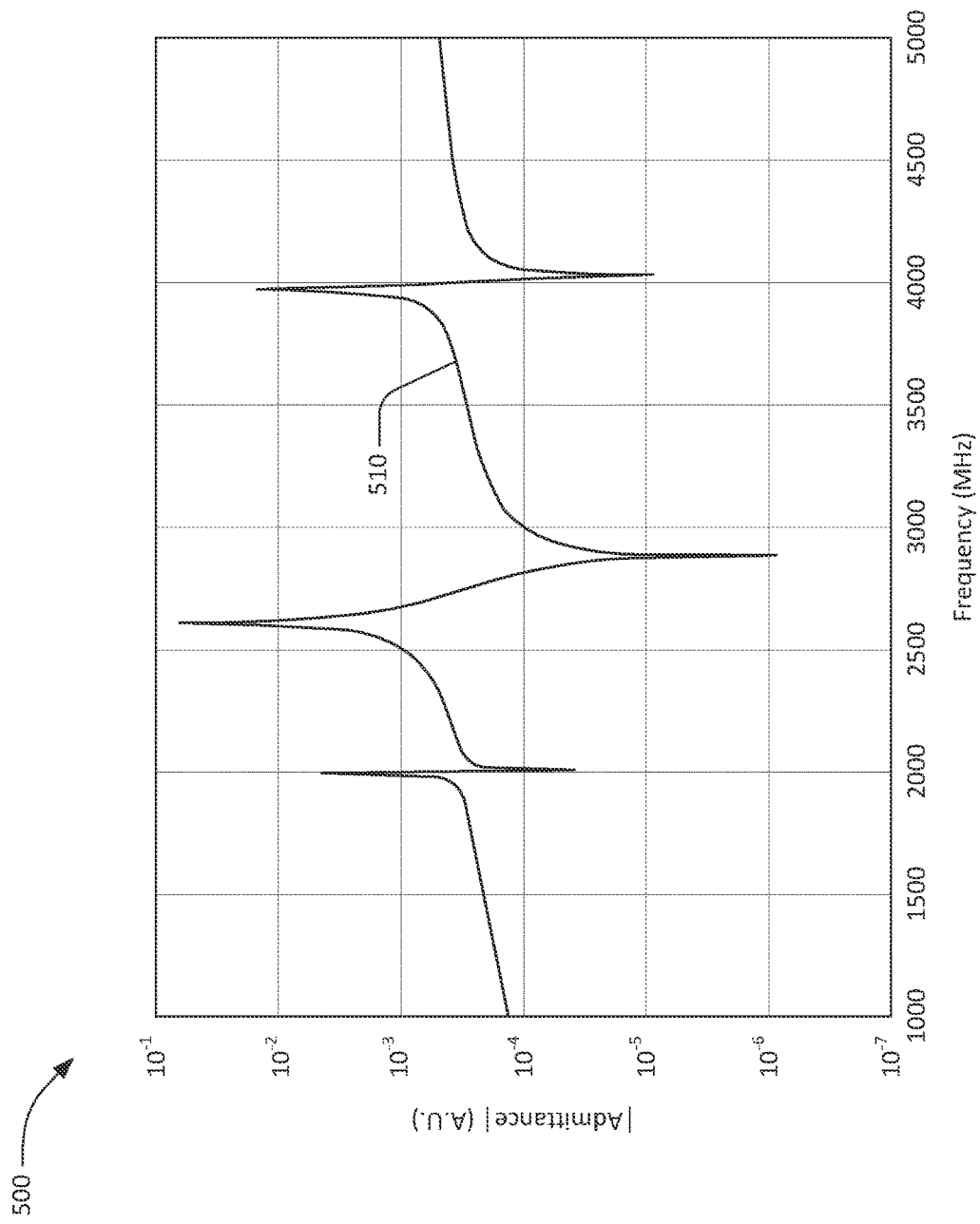
FIG. 5 is a graph of admittance as a function of frequency for an acoustic resonator with a high acoustic velocity layer.

FIG. 5 is a graph 500 of a curve 510 showing simulated admittance as a function of frequency for an acoustic resonator with a high acoustic velocity layer, which is diamond in this example. In this example, p=1 micron, hM=80 nm, hLN=400 nm, and hD=300 nm. By adding a diamond layer, the acoustic wave is accelerated and its velocity increased. However, coupling is reduced because the wave energy is redistributed between the piezo-active LN layer and the passive diamond layer. Resonance frequency at 2606 MHz, corresponding to a velocity of 5212 m/s, is created by a SH0 mode which is significantly accelerated due to the diamond layer. The coupling (R-a-R=9.85%) remains strong compared to, for example, leaky SAW in widely used 42° LiTaO3 6substrate. The SH0 type main resonance has displacement dominantly in the aperture direction. The majority of the motion is inside the LN layer and the fingers, although some vibrations go entirely through the diamond layer. Curve 510 shows a lack of spurious modes close to resonance-antiResonance frequencies.

Figure 6:
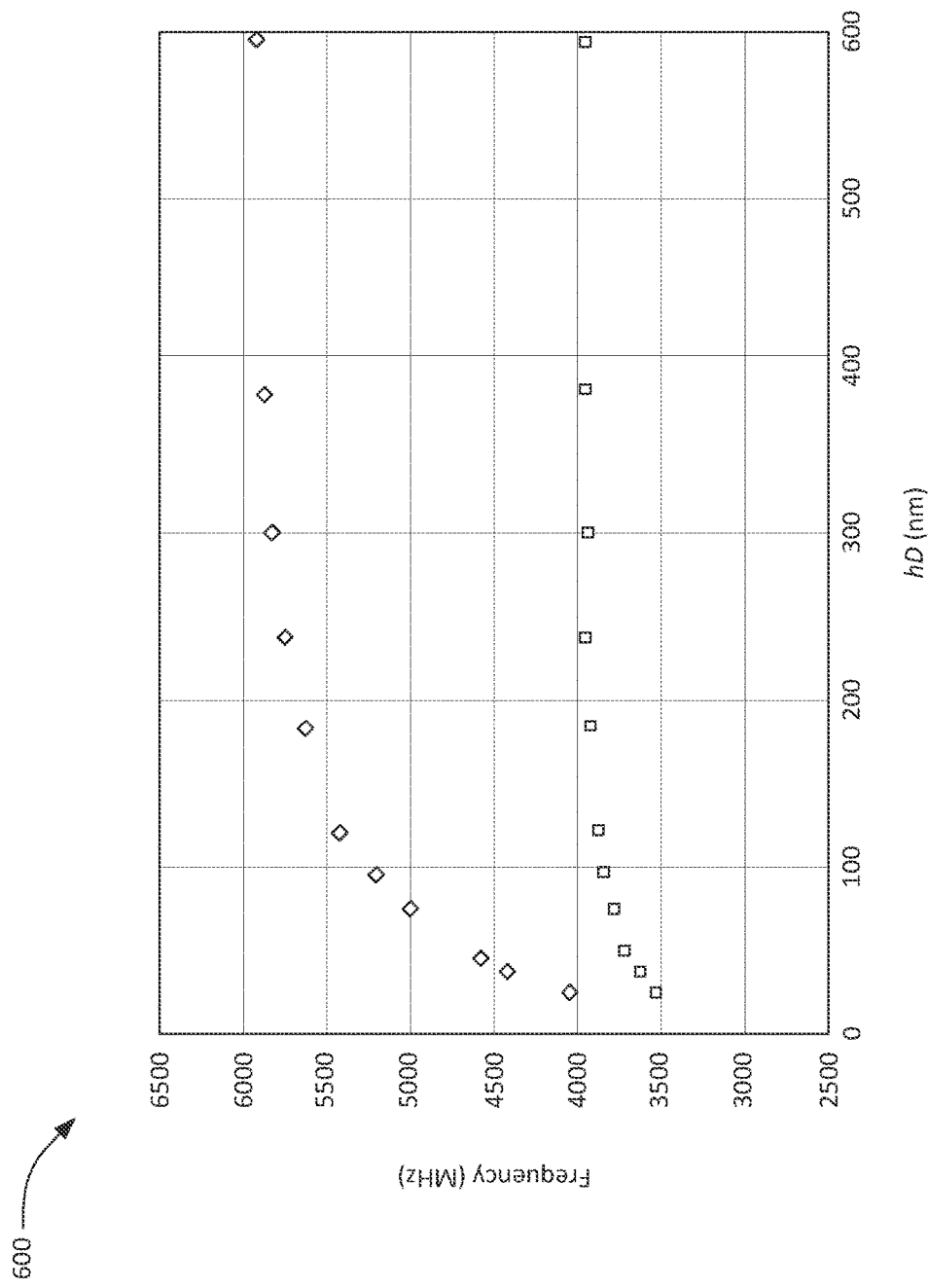
FIG. 6 is a graph of resonance frequency as a function of high acoustic velocity layer thickness for acoustic resonators with a high acoustic velocity layer.

FIG. 6 is a graph 600 of simulated resonance frequency as a function of high acoustic velocity layer thickness for acoustic resonators with a high acoustic velocity layer. The diamond-shaped indicators show frequency as a function of a diamond high acoustic velocity layer thickness for a LN piezoelectric layer thickness of 120 nm. The square-shaped indicators show frequency as a function of a diamond high acoustic velocity layer thickness for a LN piezoelectric layer thickness of 300 nm. For both the diamond-shaped indicators and the square-shaped indicators, p=0.6 microns and hM=60 nm.

Figure 7:
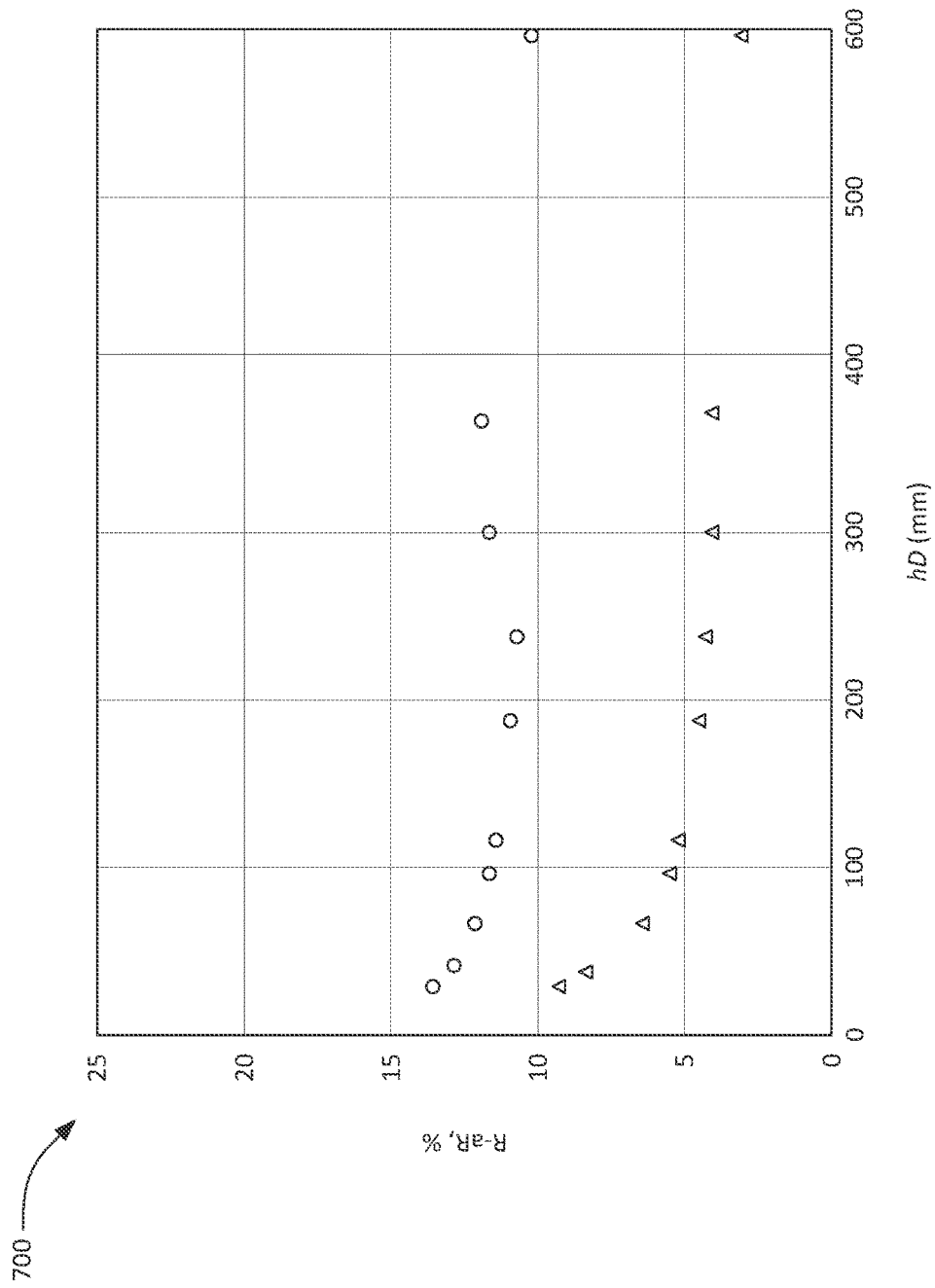
FIG. 7 is a graph of relative frequency resonance-anti-resonance distance as a function of high acoustic velocity layer thickness for acoustic resonators with a high acoustic velocity layer.

FIG. 7 is a graph 700 of simulated resonance-antiresonance distance as a function of high acoustic velocity layer thickness for acoustic resonators with a high acoustic velocity layer. The circle-shaped indicators show resonance-antiresonance distance R-a-R as a function of high acoustic velocity layer thickness for a LN piezoelectric layer thickness of 120 nm. The upward-pointing triangle-shaped indicators show resonance-antiresonance distance as a function of high acoustic velocity layer thickness for a LN piezoelectric layer thickness of 300 nm. For both the circle-shaped indicators and the upward-pointing triangle-shaped indicators, p=0.6 microns and hM=60 nm. Around hD=300 nm-500 nm for the circle-shaped indicators, the parasitic mode perturbs the main resonance and the coupling value is also changed. This range of stack parameters may not be suitable for filter design.

Figure 8:
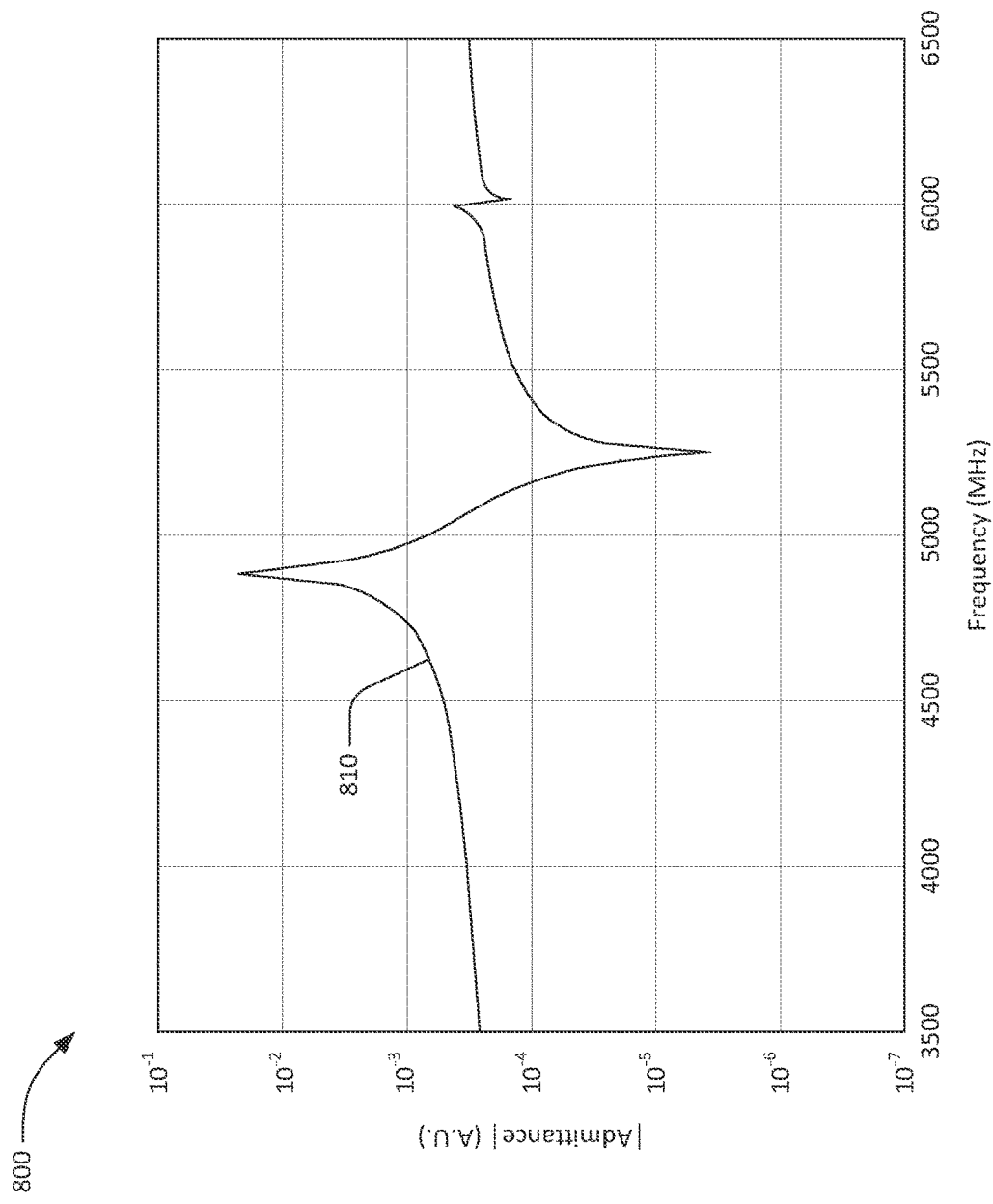
FIG. 8 is a graph of admittance as a function of frequency for another acoustic resonator with a high acoustic velocity layer.

FIG. 8 is a graph 800 of a curve 810 showing simulated admittance as a function of frequency for another acoustic resonator with a thicker diamond high acoustic velocity layer on a LN piezoelectric layer. In this example, p=0.6 microns, hM=60 nm, hLN=180 nm, and hD=2400 nm. Resonance frequency is 4893.1 MHz, resonance Q-value is 480, resonance admittance is 0.020, antiresonance frequency is 5250.7 MHz, antiresonance Q-value is 500, and R-a-R is 7.05%. The results of the thicker diamond layer both on a substrate and over a cavity are indistinguishable.

Figure 9:
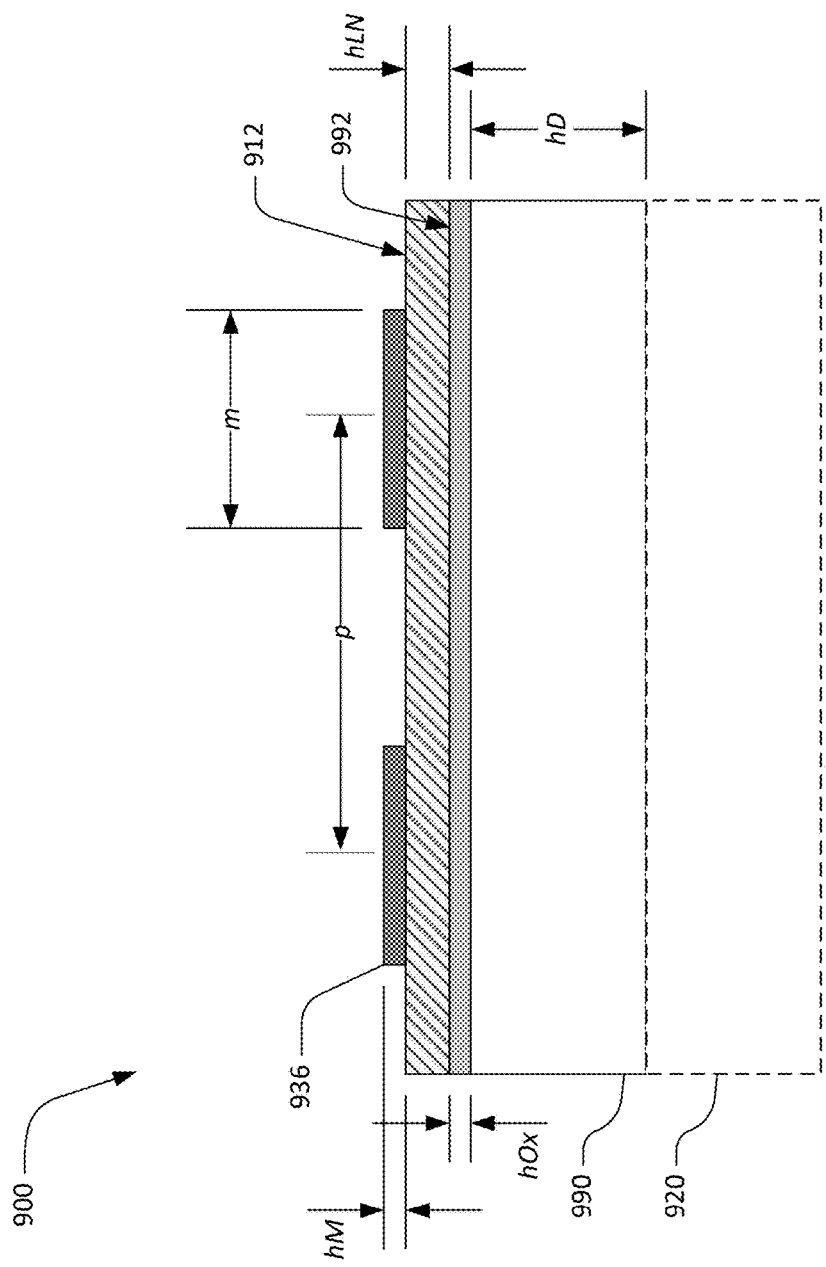
FIG. 9 is a cross-sectional view of another acoustic resonator with a high acoustic velocity layer and a silicon dioxide layer.

FIG. 9 is a cross-sectional view of another acoustic resonator 900 with a high acoustic velocity layer 990 and an oxide layer 992, e.g., silicon dioxide or SiOx, with a thickness hOx between the high acoustic velocity layer 990 and the piezoelectric layer 992. The oxide layer can facilitate attachment of the high acoustic velocity layer and the piezoelectric layer, as well as improve temperature frequency coefficient.

The high acoustic velocity layer 990, e.g., diamond or cubic boron nitride having a thickness hD, is on a back side of the piezoelectric layer 912 having a thickness hLN. The piezoelectric layer 912 can be LN, e.g., 30 degree Y-cut LN. The high acoustic velocity layer 990 can optionally be on a substrate 920 or over a cavity, as described above with respect to FIG. 1. In an example, if the high velocity layer 990 is thicker than 3 microns, the high velocity layer 990 can be mounted on a dielectric substrate such as silicon or sapphire, and the acoustic vibrations will not reach the substrate. Fingers 936 of an IDT having a thickness hM are on a front side of the piezoelectric layer 912. The fingers 936 have a width m and a pitch p, as described above with respect to FIG. 1. In an example, the fingers 936 can be aluminum.

Figure 10:
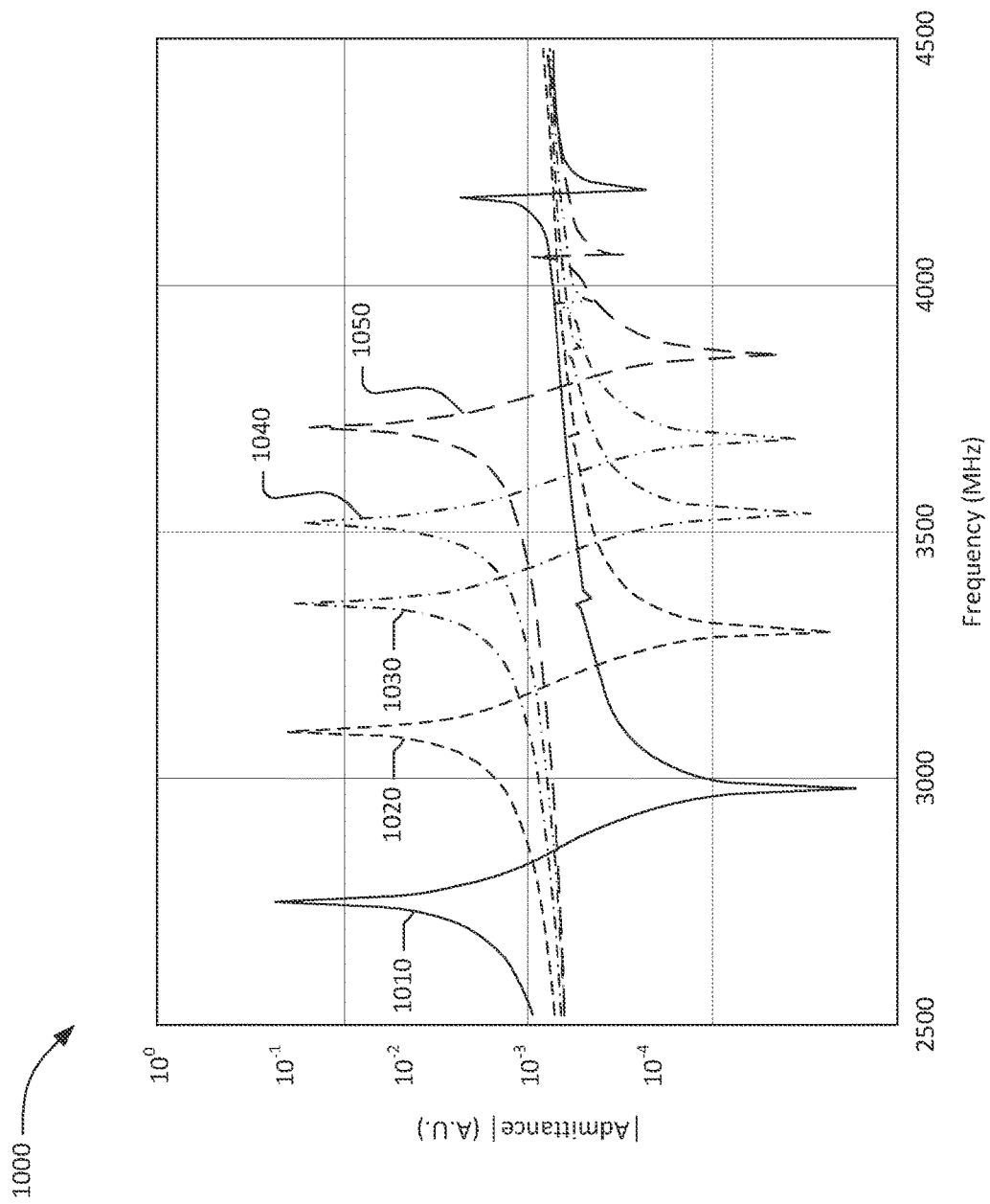
FIG. 10 is a graph of admittance as a function of frequency for an acoustic resonator with a high acoustic velocity layer and a silicon dioxide layer.

FIG. 10 is a graph 1000 of simulated admittance as a function of frequency for acoustic resonators with diamond high acoustic velocity layers, LN layers, and silicon dioxide layers of various thicknesses. In this example, p=1.0 microns, hD=200 nm, and hM=80 nm. For curve 1010, a thickness of the silicon dioxide layer is 80 nm, and coupling is 8%. For curve 1020, a thickness of the silicon dioxide layer is 40 nm, and coupling is 6.3%. For curve 1030, a thickness of the silicon dioxide layer is 20 nm, and coupling is 5.3%. For curve 1040, a thickness of the silicon dioxide layer is 10 nm, and coupling is 4.67%. For curve 1050, there is no silicon dioxide layer, and coupling is 4.0%. As can be seen in graph 1000, coupling increased with increasing silicon dioxide layer thickness. This could be attributed to slowing of the acoustic wave due to the presence of the silicon dioxide material with a low shear wave velocity. The relative thickness of the LN layer is reduced, resulting in a more homogeneous field distribution within the LN layer and increased coupling. The amplitude of the wave in the diamond layer is also reduced, decreasing the mechanical energy stored in the diamond layer.

Figure 11:
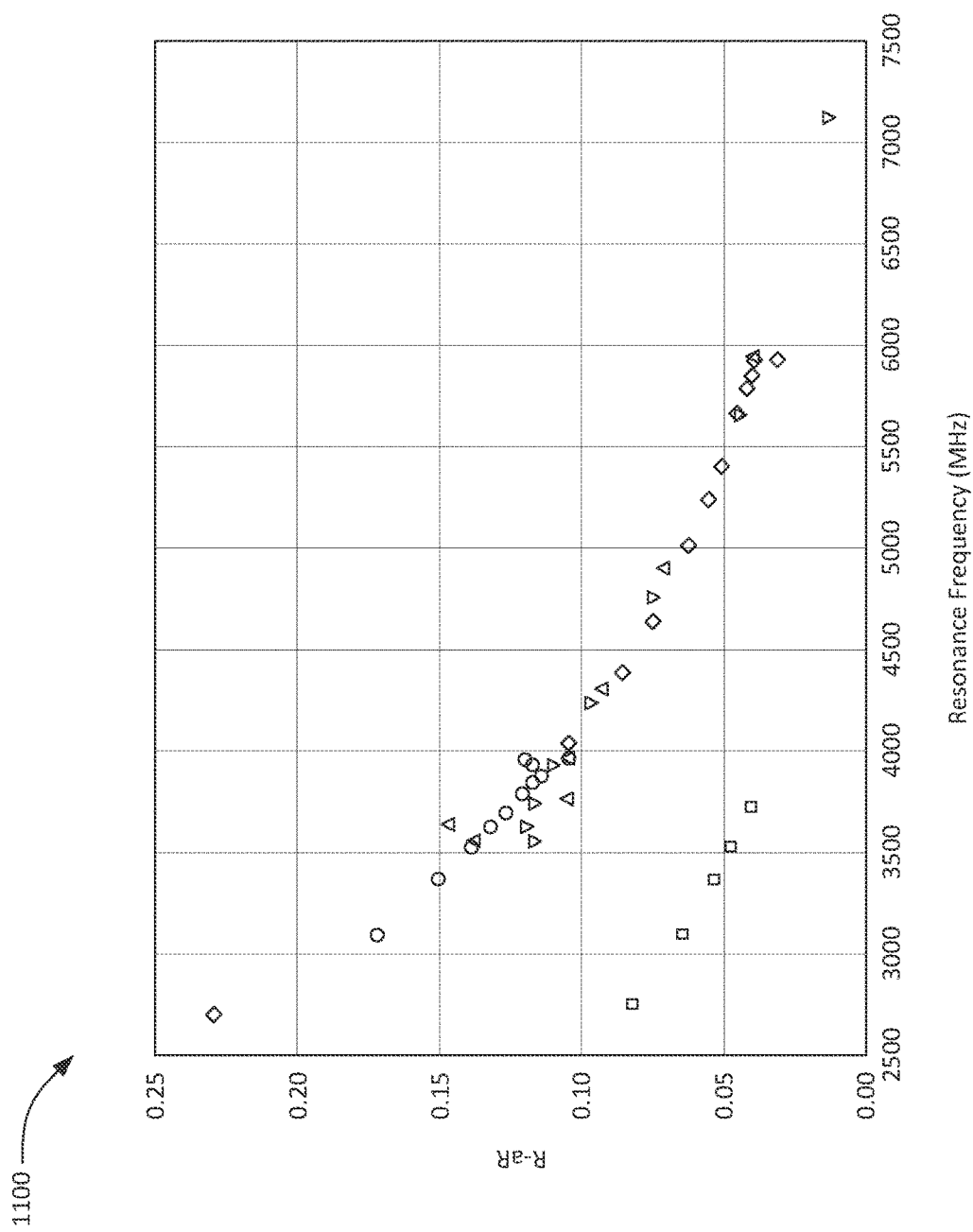
FIG. 11 is a graph of resonance-antiresonance coupling as a function of resonance frequency for various acoustic resonators.

FIG. 11 is a graph 1100 of simulated resonance-antiresonance coupling as a function of resonance frequency for various acoustic resonators. The square indicators show resonance-antiresonance coupling as a function of resonance frequency for an acoustic resonator with a LN piezoelectric layer, a silicon dioxide layer, and a diamond high acoustic velocity layer. The upward-pointing triangle indicators show resonance-antiresonance coupling as a function of resonance frequency for an acoustic resonator with a LN piezoelectric layer, and a diamond high acoustic velocity layer with a thickness hD of 2000 nm. The downward-pointing triangle indicators show resonance-antiresonance coupling as a function of resonance frequency for an acoustic resonator with a LN piezoelectric layer, and a diamond high acoustic velocity layer with a thickness hD of 130 nm. The circle indicators show resonance-antiresonance coupling as a function of resonance frequency for an acoustic resonator with a LN piezoelectric layer having a thickness hLN of 300 nm and no high acoustic velocity layer. The diamond-shaped indicators show resonance-antiresonance coupling as a function of resonance frequency for an acoustic resonator with a LN piezoelectric layer having a thickness hLN of 120 nm and no high acoustic velocity layer. For all acoustic resonators in this example, p=0.6 microns, except for the square indicators, where p=1.0 micron and results in the shift to lower frequencies. Graph 1100 demonstrates the dependence between achievable frequency and R-a-R coupling.

Description of Methods

Figure 12:
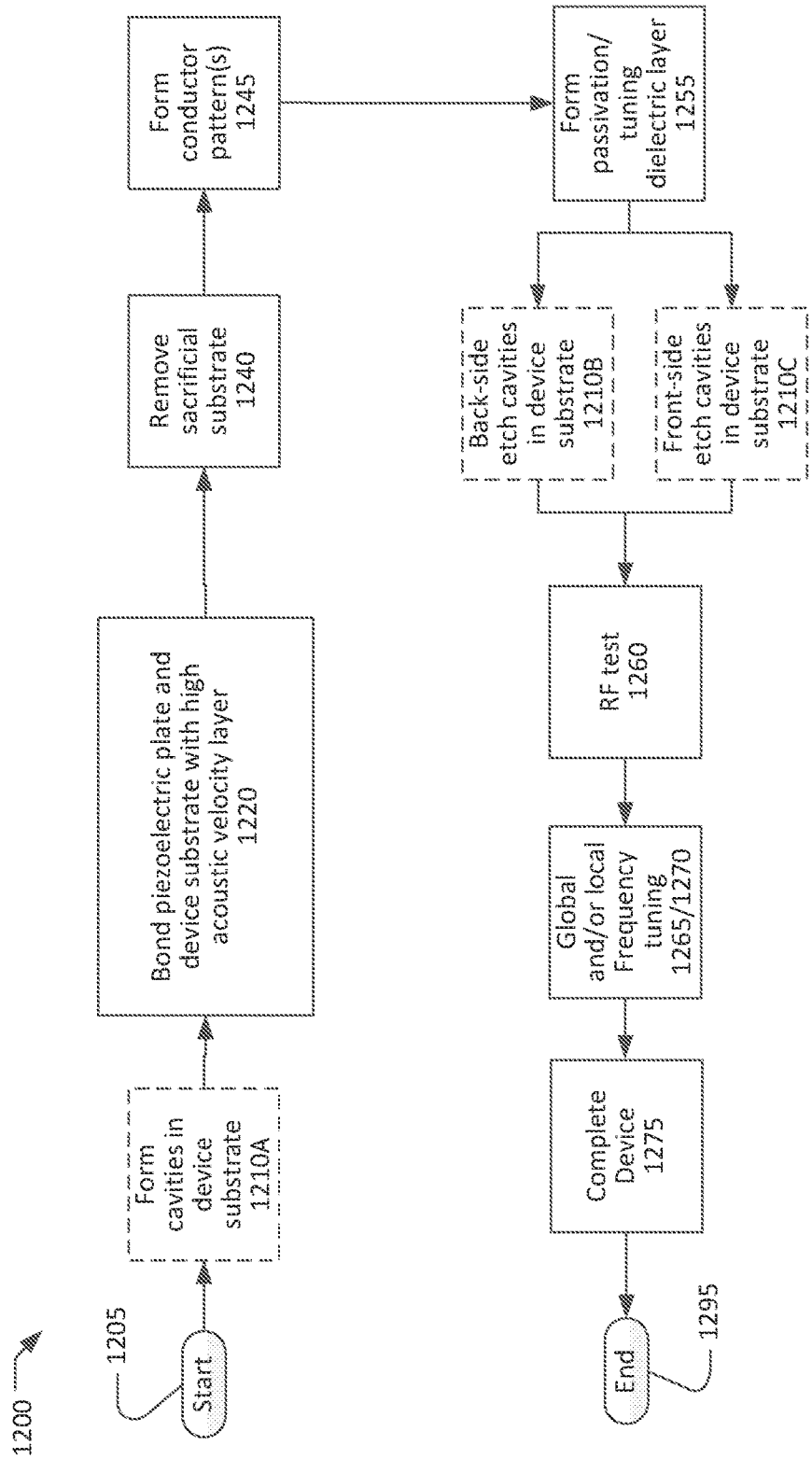
FIG. 12 is a flow chart of a method for fabricating a filter with acoustic resonators with high acoustic velocity layers.

FIG. 12 is a simplified flow chart summarizing a process 1200 for fabricating a filter device incorporating acoustic resonators with high acoustic velocity layers. Specifically, the process 1200 is for fabricating a filter device including multiple acoustic resonators, some of which may include a frequency setting dielectric or coating layer. The process 1200 starts at 1205 with a device substrate having a layer of high acoustic velocity material (e.g., a deposited layer of high acoustic velocity material) and a plate of piezoelectric material disposed on a sacrificial substrate. The process 1200 ends at 1295 with a completed filter device. The flow chart of FIG. 12 includes only major process steps. Various conventional process steps (e.g. surface preparation, cleaning, inspection, baking, annealing, monitoring, testing, etc.) may be performed before, between, after, and during the steps shown in FIG. 12.

While FIG. 12 generally describes a process for fabricating a single filter device, multiple filter devices may be fabricated simultaneously on a common wafer (consisting of a piezoelectric plate bonded to a substrate). In this case, each step of the process 1200 may be performed concurrently on all of the filter devices on the wafer.

The flow chart of FIG. 12 captures several variations of the process 1200 for making an acoustic resonator which differ in whether or not cavities are formed in the device substrate and, if so, when and how the cavities are formed. The cavities may be formed at steps 1210A, 1210B, or 1210C. At most one of these steps is performed in each of the three variations of the process 1200.

The piezoelectric plate may typically be rotated YX-cut LN, such as 30° rotated Y-cut, having maximal piezoelectric coupling for SH0 mode. The piezoelectric plate may be some other material and/or some other cut. The device substrate may preferably be silicon. The device substrate may be some other material that allows formation of deep cavities by etching or other processing.

In one variation of the process 1200, one or more cavities are formed in the device substrate at 1210A, before the high velocity acoustic layer is bonded to the substrate at 1230. A separate cavity may be formed for each resonator in a filter device. Also, the cavities can be shaped and formed such that two or more resonators can be on one diaphragm over one cavity. The one or more cavities may be formed using conventional photolithographic and etching techniques. Typically, the cavities formed at 1210A will not penetrate through the device substrate.

At 1220, the piezoelectric plate and the high acoustic velocity layer on the device substrate are bonded. The high acoustic velocity layer and the piezoelectric plate may be bonded by a wafer bonding process. Typically, the mating surfaces of the piezoelectric plate and the high acoustic velocity layer are highly polished. One or more layers of intermediate materials, such as an oxide or metal (e.g., $SiO_2$ having an exemplary thickness of 20 nm), may be formed or deposited on the mating surface of one or both of the high acoustic velocity layer and the piezoelectric plate. One or both mating surfaces may be activated using, for example, a plasma process. The mating surfaces may then be pressed together with considerable force to establish molecular bonds between the piezoelectric plate and the piezoelectric plate or intermediate material layers.

At 1240, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 1240, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

A first conductor pattern, including IDTs and reflector elements of each acoustic resonator, is formed at 1245 by depositing and patterning one or more conductor layers on the front side of the piezoelectric plate. All or portions of the first conductor pattern may be over the coating layer formed at 1225. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 1245 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 1245 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1255, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 1200, the passivation/tuning dielectric layer may be formed after the cavities in the device substrate are etched at either 1210B or 1210C.

In a second variation of the process 1200, one or more cavities are formed in the back side of the optional device substrate at 1210B. A separate cavity may be formed for each resonator in a filter device. Also, the cavities can be shaped and formed such that two or more resonators can be on one diaphragm over one cavity. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 1200, one or more cavities in the form of recesses in the optional device substrate may be formed at 1210C by etching the substrate using an etchant introduced through openings in the piezoelectric plate. A separate cavity may be formed for each resonator in a filter device. Also, the cavities can be shaped and formed such that two or more resonators can be on one diaphragm over one cavity. The one or more cavities formed at 1210C will not penetrate through the device substrate. For all cavity forming steps 1210A, 1210B, and 1210C, the dimensions of the cavity will be formed with respect to the dimensions of the IDTs of the conductor pattern, as described above. In other variations, the device substrate is removed entirely after the high acoustic velocity layer is bonded to the piezoelectric plate.

Ideally, most or all of the filter devices on a wafer will meet a set of performance requirements. However, normal process tolerances will result in variations in parameters such as the thicknesses of dielectric layer formed at 1255, variations in the thickness and line widths of conductors and IDT fingers formed at 1245, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 1255. The frequency of a filter device passband can be lowered by adding material to the passivation/tuning layer, and the frequency of the filter device passband can be increased by removing material to the passivation/tuning layer. Typically, the process 1200 is biased to produce filter devices with passbands that are initially lower than a required frequency range but can be tuned to the desired frequency range by removing material from the surface of the passivation/tuning layer.

At 1260, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 1265, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 1260 may be processed to generate a global contour map indicating the amount of material to be removed as a function of two-dimensional position on the wafer. The material is then removed in accordance with the contour map using the selective material removal tool.

At 1270, local frequency tuning may be performed in addition to, or instead of, the global frequency tuning performed at 1265. "Local" frequency tuning is performed with a spatial resolution smaller than an individual filter device. The test results from 1260 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 1265 and/or 1270, the filter device is completed at 1275. Actions that may occur at 1275 include forming bonding pads or solder bumps or other means for making connection between the device and external circuitry (if such pads were not formed at 1245); excising individual filter devices from a wafer containing multiple filter devices; other packaging steps; and additional testing. After each filter device is completed, the process ends at 1295.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

The invention claimed is:

1. An acoustic resonator device comprising:
    a piezoelectric layer having front and back surfaces;
    a high acoustic velocity layer on the back surface, wherein the high acoustic velocity layer has a higher acoustic velocity than an acoustic velocity of the piezoelectric layer; and
    an interdigital transducer (IDT) on the front surface,
    wherein a thickness of the high acoustic velocity layer is smaller than a pitch of interleaved fingers of the IDT, and
    wherein the pitch is a center-to-center spacing of adjacent fingers of the interleaved fingers of the IDT.

2. The device of claim 1, wherein the piezoelectric layer is lithium niobate.

3. The device of claim 1, wherein the high acoustic velocity layer is diamond.

4. The device of claim 1, wherein the high acoustic velocity layer is boron nitride.

5. The device of claim 1, further comprising a substrate, wherein the high acoustic velocity layer is directly attached to the piezoelectric layer and is between the piezoelectric layer and the substrate.

6. The device of claim 1, wherein the interleaved fingers of the IDT are positioned over a cavity of the acoustic resonator device.

7. The device of claim 2, wherein the IDT is configured such that a radio frequency signal applied to the IDT excite a shear horizontal acoustic mode in the piezoelectric layer, the shear horizontal acoustic mode being a bulk shear mode where acoustic energy propagates along a direction substantially parallel to the front surface of the piezoelectric layer and with displacements normal to a direction of an electric field created by the interleaved fingers.

8. The device of claim 1, further comprising an oxide layer between the piezoelectric layer and the high velocity acoustic layer.

9. A filter device comprising:
a piezoelectric layer comprising lithium niobate and having front and back surfaces;
a high acoustic velocity layer on the back surface, wherein the high acoustic velocity layer has a higher acoustic velocity than an acoustic velocity of the piezoelectric layer; and
a conductor pattern on the front surface, the conductor pattern comprising a plurality of interdigital transducers (IDTs) of a respective plurality of resonators including at least one series resonator and at least one shunt resonator,
wherein a thickness of the high acoustic velocity layer is smaller than a pitch of interleaved fingers of at least one IDT of the plurality of IDTs, and
wherein the pitch is a center-to-center spacing of adjacent fingers of the interleaved fingers of the at least one IDT of the plurality of IDTs.

10. The device of claim 9, wherein the high acoustic velocity layer is diamond.

11. The device of claim 9, wherein the high acoustic velocity layer is boron nitride.

12. The device of claim 9, further comprising a substrate, wherein the high acoustic velocity layer is directly attached to the piezoelectric layer and is between the piezoelectric layer and the substrate.

13. The device of claim 12, wherein the interleaved fingers of the at least one IDT are positioned over at least one cavity of the filter device.

14. The device of claim 9, wherein the respective IDTs of the plurality of IDTs are configured such that respective radio frequency signals applied to the IDTs excite a shear horizontal acoustic mode in the piezoelectric layer, the shear horizontal acoustic mode being a bulk shear mode where acoustic energy propagates along a direction substantially parallel to the front surface of the piezoelectric layer and with displacements normal to a direction of an electric field created by the interleaved fingers.

15. The device of claim 9, further comprising an oxide layer between the piezoelectric layer and the high acoustic velocity layer.

16. A method of fabricating an acoustic resonator device, the method comprising:
attaching a high acoustic velocity layer to a back side of a piezoelectric layer, wherein the high acoustic velocity layer has a higher acoustic velocity than an acoustic velocity of the piezoelectric layer; and
forming an interdigital transducer (IDT) on a front side of the piezoelectric layer,
wherein the high acoustic velocity layer is formed to have a thickness that is smaller than a pitch of interleaved fingers of the IDT, the pitch being a center-to-center spacing of adjacent fingers of the interleaved fingers of the IDT.

17. The method of claim 16, wherein the piezoelectric layer is lithium niobate.

18. The method of claim 16, wherein the high acoustic velocity layer is diamond.

19. The device of claim 16, wherein the high acoustic velocity layer is boron nitride.

20. The device of claim 1, wherein at least one finger of the interleaved fingers of the IDT has a thickness that is less than 12% of $\lambda$, and wherein $\lambda$ is equal to two times the pitch.

* * * * *